(12) United States Patent
Fan

(10) Patent No.: US 10,079,609 B2
(45) Date of Patent: Sep. 18, 2018

(54) DAC CAPACITOR ARRAY, ANALOG-TO-DIGITAL CONVERTER, AND METHOD FOR REDUCING POWER CONSUMPTION OF ANALOG-TO-DIGITAL CONVERTER

(71) Applicant: SHENZHEN GOODIX TECHNOLOGY CO., LTD., Shenzhen, Guangdong (CN)

(72) Inventor: Shuo Fan, Guangdong (CN)

(73) Assignee: SHENZHEN GOODIX TECHNOLOGY CO., INC., Shenzhen, Guangdong (CN)

( * ) Notice: Subject to any disclaimer, the term of this patent is extended or adjusted under 35 U.S.C. 154(b) by 0 days.

(21) Appl. No.: 15/784,514

(22) Filed: Oct. 16, 2017

(65) Prior Publication Data
US 2018/0115317 A1    Apr. 26, 2018

Related U.S. Application Data

(63) Continuation of application No. PCT/CN2016/103185, filed on Oct. 25, 2016.

(51) Int. Cl.
*H03M 1/66* (2006.01)
*H03M 1/00* (2006.01)
*H03M 1/46* (2006.01)

(52) U.S. Cl.
CPC ........... *H03M 1/002* (2013.01); *H03M 1/468* (2013.01); *H03M 1/462* (2013.01)

(58) Field of Classification Search
CPC ..... H03M 1/002; H03M 1/1245; H03M 1/466
(Continued)

(56) References Cited

U.S. PATENT DOCUMENTS 5,606,320 A * 2/1997 Kleks .................... H03M 1/002
                                                                  341/118
7,038,609 B1 * 5/2006 Hurrell ................. H03M 1/145
                                                                  341/156
(Continued)

FOREIGN PATENT DOCUMENTS

CN          1732624 A        2/2006
CN        102801422 A       11/2012
(Continued)

OTHER PUBLICATIONS

State Intellectual Property Office of the P.R. China (ISR/CN), "International Search Report for PCT/CN2016/103185", China, dated Jun. 28, 2017.

*Primary Examiner* — Lam T Mai
(74) *Attorney, Agent, or Firm* — Heslin Rothenberg Farley & Mesiti P.C.

(57) ABSTRACT

This disclosure discloses a DAC capacitor array, which includes a plurality of sub-capacitor arrays that are connected in parallel. Each sub-capacitor array includes: a capacitor group, including N capacitors connected in parallel, N being a positive integer; and a primary switch and a plurality of multiplexers; wherein one terminal of each capacitor in the capacitor group is connected to an input terminal of a comparator, and is connected to an input source via the primary switch; and the other terminals of the capacitors in the capacitor group are connected to a plurality of input sources via corresponding multiplexers respectively. The DAC capacitor array is optimized by adjusting the reference voltage to which the capacitors in the DAC capacitor array are connected, which reduces the overall capacitance of the DAC capacitor array.

13 Claims, 4 Drawing Sheets

(58) Field of Classification Search
USPC .................................................. 341/130–160
See application file for complete search history.

(56) References Cited

U.S. PATENT DOCUMENTS

| | | | | |
|---|---|---|---|---|
| 8,981,985 | B2* | 3/2015 | Lian .................... | H03M 1/1225 |
| | | | | 341/155 |
| 2007/0109168 | A1* | 5/2007 | Hennessy ........... | H03M 1/0639 |
| | | | | 341/155 |
| 2012/0146712 | A1* | 6/2012 | Kull ...................... | G11C 5/147 |
| | | | | 327/530 |
| 2016/0254821 | A1* | 9/2016 | Luo ....................... | H03M 1/125 |
| | | | | 341/161 |
| 2017/0194978 | A1* | 7/2017 | Hernes .................. | H03M 1/002 |
| 2017/0250699 | A1* | 8/2017 | Fuchs .................. | H03M 1/1038 |
| 2017/0317683 | A1* | 11/2017 | Bandyopadhyay ... | H03M 1/002 |

FOREIGN PATENT DOCUMENTS

| | | |
|---|---|---|
| CN | 103441765 A | 12/2013 |
| CN | 104113340 A | 10/2014 |

* cited by examiner

DAC CAPACITOR ARRAY, ANALOG-TO-DIGITAL CONVERTER, AND METHOD FOR REDUCING POWER CONSUMPTION OF ANALOG-TO-DIGITAL CONVERTER

CROSS-REFERENCE TO RELATED APPLICATIONS

The present application is a continuation of international application No. PCT/CN2016/103185, filed on Oct. 25, 2016, which is incorporated herein by reference in its entirety.

TECHNICAL FIELD

Embodiments of the present disclosure relate to the technical field of integrated circuits, and in particular, relate to a DAC capacitor array, an analog-to-digital converter, and a method for reducing power consumption of the analog-to-digital converter.

BACKGROUND

A successive approximation register analog-to-digital converter (SAR ADC) is capable of converting an analog signal into a digital signal. Referring to FIG. 1, the SAR ADC is formed of a comparator, a register and a digital-to-analog converter (DAC), the principle of converting the analog signal into the digital signal by the SAR ADC is: comparing an analog input signal with a reference signal which is provided by an output of a D/A converter (DAC), determining to increase or decrease the digital signal input to the DAC according to the comparison result such that the reference signal approximates to the analog input signal, and when the reference signal is equal to the analog input signal, the digital signal input to the DAC is the digital signal corresponding to the analog input signal. Thus, the analog-to-digital conversion can be implemented by means of successive approximation of the DAC output to the voltage of the analog input signal, and the process of the successive approximation may be referenced to FIG. 2.

The SAR ADC can be used as a key component for interfacing between an analog module and a digital module, and is extensively applied to mobile devices, wireless sensors and the like. Due to the size and battery life of the device, the analog-to-digital converter with small size and low power consumption is needed, such that the analog-to-digital converter can be conveniently integrated into the circuits of various devices.

Two types of DAC capacitor arrays applicable to the SAR analog-to-digital converter may be provided in the related art, as illustrated in FIG. 3 and FIG. 4 respectively.

FIG. 3 illustrates a conventional DAC capacitor array. Capacitors in the DAC capacitor array are not arranged in a binary weighting manner according to the capacitance values thereof. Each branch has the identical unit capacitor. Since the manufacturing error is proportional to the capacitance value and area of the capacitor, the manufacturing error may be reduced if the identical unit capacitors are employed. Relative to the capacitor arrays arranged in a binary weighting manner according to the capacitance values thereof, the size and power consumption of the entire capacitor array may be reduced when the identical unit capacitors are employed. However, this technical solution may have a problem that too many control branches are needed for the array, which may directly cause an increase of size and power consumption of the control circuit, the advantages achieved by reduction of the capacitor area are reduced or even disappear.

FIG. 4 illustrates another conventional DAC capacitor array. In the DAC capacitor array shown in FIG. 4, except two unit capacitors on the right side, the other capacitors are arranged in a binary weighting manner according to the capacitance values thereof. For the DAC capacitor array, the power consumption of the circuit may be effectively reduced by changing the reference voltage of the unit capacitors on the right side of the DAC capacitor array. However, if there are too many capacitors that are arranged in the binary weighting manner, the total capacitance may be very large, the power consumption of the circuit may be increased, or even power consumption reduction achieved by changing the reference voltage of the right-side unit capacitor may be offset.

SUMMARY

In view of the above, embodiments of the present disclosure provide a DAC capacitor array, an analog-to-digital converter, and a method for reducing power consumption of the analog-to-digital converter, to reduce the total capacitance of an SAR analog-to-digital converter, and thus may reduce the size and power consumption of the analog-to-digital converter and reduce the power consumption.

In a first aspect, embodiments of the present disclosure provide a digital-to-analog converter (DAC) capacitor array, the DAC capacitor array is applied in an SAR analog-to-digital converter. The DAC capacitor array includes a plurality of sub-capacitor arrays that are connected in parallel, each of the plurality of sub-capacitor arrays includes:

a capacitor group, including N capacitors connected in parallel, N is a positive integer; and a primary switch and a plurality of multiplexers; wherein one terminal of each capacitor of the capacitor group is connected to an input terminal of a comparator and to an input source via the primary switch; and the other terminal of each capacitor of the capacitor group is connected to a plurality of input sources via a corresponding multiplexer.

Further, the DAC capacitor array further includes a symmetrical capacitor array; wherein one terminal of each capacitor of the symmetrical capacitor array is connected to the other terminal of the comparator.

Further, the capacitor group includes a significant-bit sub-capacitor group, a non-significant-bit sub-capacitor group and a supplement-bit capacitor; wherein the supplement-bit capacitor is a unit capacitor, the number of capacitors of the significant-bit capacitor group is P, and the number of capacitors of the non-significant-bit sub-capacitor group is M, and P and M are both a positive integer less than N and satisfy the following equation:

$$N=M+P+1.$$

Further, the input source includes an analog input signal and a plurality of reference voltages, the reference voltage has a voltage value range of 0 to $V_R$, reference voltages to which the significant-bit sub-capacitor group is connected include 0, $$\frac{V_R}{2}$$

and $V_R$, reference voltages to which the non-significant-bit sub-capacitor group is connected include $$\frac{2^M-1}{2^{M+1}}V_R, \frac{V_R}{2} \text{ and } \frac{2^M+1}{2^{M+1}}V_R,$$

and value of $V_R$ can be adjusted.

In a second aspect, embodiments of the present disclosure provide a successive approximation Resister (SAR) analog-to-digital converter. The SAR analog-to-digital converter includes a comparator, a register connected to an output terminal of the comparator, and a digital-to-analog converter (DAC) capacitor array connected to an input terminal of the comparator; wherein the DAC capacitor array includes:

a plurality of sub-capacitor arrays that are connected in parallel, each of the plurality of sub-capacitor arrays includes:

a capacitor group including a plurality of capacitors that are connected in parallel;

a primary switch and a plurality of multiplexers;

one terminal of each capacitor of the capacitor group is connected to an input terminal of a comparator and to an input source via the primary switch; and the other terminal of each capacitor of the capacitor group is connected to a plurality of input sources via a corresponding multiplexers.

Further, the SAR analog-to-digital converter further includes a symmetrical capacitor array; wherein one terminal of each capacitor of the symmetrical capacitor array is connected to the other terminal of the comparator.

Further, the capacitor group includes a significant-bit sub-capacitor group, a non-significant-bit sub-capacitor group and a supplement-bit capacitor; wherein the supplement-bit capacitor is a unit capacitor, the number of capacitors of the significant-bit capacitor group is P, and the number of capacitors of the non-significant-bit sub-capacitor group is M, and P and M are both a positive integer less than N and satisfy the following equation, where N represent the number of capacitors of the capacitor group:

$N=M+P+1.$

Further, the input source includes an analog input signal and a plurality of reference voltages, the reference voltage has a voltage value range of 0 to $V_R$, reference voltages to which the significant-bit sub-capacitor group is connected include 0, $$\frac{V_R}{2}$$

and $V_R$, reference voltages to which the non-significant-bit sub-capacitor group is connected include $$\frac{2^M-1}{2^{M+1}}V_R, \frac{V_R}{2} \text{ and } \frac{2^M+1}{2^{M+1}}V_R,$$

and $V_R$ has an adjustable value.

Further, the capacitors are arranged from the most significant bit to the least significant bit, capacitance values of the capacitors in the significant-bit sub-capacitor group are sequentially $H_P, H_{P-1}, \ldots, H_2$ and $H_1$, and capacitance values of the capacitors in the non-significant-bit sub-capacitor group are sequentially $L_M, L_{M-1}, \ldots, L_2$ and $L_1$; where values of $H_{P-1}V_R, H_2V_R, \ldots, H_2V_R, H_1V_R,$ $$\frac{1}{2^{M+1}}L_M V_R, \frac{1}{2^{M+1}}L_{M-1}V_R, \ldots, \frac{1}{2^{M+1}}L_2 V_R, \frac{1}{2^{M+1}}L_1 V_R$$

satisfy a equal ratio relation having a ratio of 2.

In a third aspect, embodiments of the present disclosure provide a method for reducing power consumption of a successive approximation register (SAR) analog-to-digital converter. The method includes:

at a sampling stage, connecting one terminal of a DAC capacitor array, which is connected to a comparator to a reference voltage $$\frac{V_R}{2}$$

via a primary switch, and connecting the other terminal of the DAC capacitor array to an analog input signal via a corresponding multiplexer, thereby completing the sampling; and at a conversion stage, turning off the primary switch of the DAC capacitor array, disconnecting the multiplexer from the analog input signal, and then connecting the multiplexer to the reference voltage $$\frac{V_R}{2},$$

comparing a terminal voltage of the DAC capacitor array connected to one input terminal of the comparator with a voltage at the other input terminal of the comparator, determining a most-significant-bit value according to a comparison result, selecting a corresponding sub-capacitor array according to the most-significant-bit value, and acquiring a second most-significant-bit value and a least-significant-bit value from the selected sub-capacitor array.

Further, the selecting a corresponding sub-capacitor array according to the most-significant-bit value includes:

connecting non-selected sub-capacitor arrays to a reference voltage 0 or a reference voltage $V_R$ when the sub-capacitor array is selected.

Further, the acquiring a second most-significant-bit value and a least-significant-bit value from the selected sub-capacitor array includes:

adjusting the reference voltages of the capacitors in the selected sub-capacitor array as $$\frac{2^M-1}{2^{M+1}}V_R \text{ or } \frac{2^M+1}{2^{M+1}}V_R$$

according to the comparison result, wherein M is the number of capacitors in a non-significant-bit sub-capacitor group in the selected sub-capacitor array.

With the DAC capacitor array, the analog-to-digital converter and the method for reducing power consumption of the analog-to-digital converter according to embodiments of the present disclosure, the DAC capacitor array is optimized by adjusting the reference voltage to which the capacitors in the DAC capacitor array are connected, which reduces the total capacitance of the DAC capacitor array. In this way, the size of the SAR analog-to-digital converter is reduced, the power consumption is reduced, and meanwhile the manufacturing cost of chips may be lowered. In addition, by modifying the conversion process between the analog signal and the digital signal, the voltage variation range between two terminals of the capacitor is narrowed and thus the total power consumption is reduced.

BRIEF DESCRIPTION OF THE DRAWINGS

To describe the technical solutions of the present disclosure or the related art more clearly, hereinafter, drawings that are to be referred for description of the embodiments or the related art are briefly described. Apparently, the drawings described hereinafter merely illustrate some embodiments of the present disclosure. Persons of ordinary skill in the art may also derive other drawings based on the drawings described herein without any creative effort.

DETAILED DESCRIPTION

To make a person skilled in the art better understand the technical solutions of present disclosure, the technical solutions according to the embodiments of the present disclosure are clearly and completely described with reference to the accompanying drawings of the embodiments of the present disclosure. Obviously, the embodiments described herein are merely exemplary ones, but are not all the embodiments. Preferred embodiments are illustrated in the accompanying drawings. The present disclosure may be practiced in various ways, and the practice is not limited to the embodiments described hereinafter. On the contrary, these embodiments are provided to make the disclosure of the present disclosure more thoroughly and completely understood. Based on the embodiments of the present disclosure, all other embodiments derived by persons of ordinary skill in the art without any creative efforts shall fall within the protection scope of the present disclosure.

Unless otherwise defined, all the technical and scientific terms used in this specification are the same as those usually understood by persons skilled in the art of the present disclosure. The terms in the specification of the present disclosure are only used to describe the specific embodiments, but not to limit the present disclosure. The terms "comprise", "include" and variations thereof in the specification, claims and accompanying drawings are intended to define a non-exclusive meaning.

Term "embodiments" in this specification signifies that the specific characteristic, structure or feature described with reference to the embodiments may be covered in at least one embodiment of the present disclosure. This term, when appears in various positions of the description, neither indicates the same embodiment, nor indicates an independent or optional embodiment that is exclusive of the other embodiments. A person skilled in the art would implicitly or explicitly understand that the embodiments described in this specification may be incorporated with other embodiments.

Figure 1:
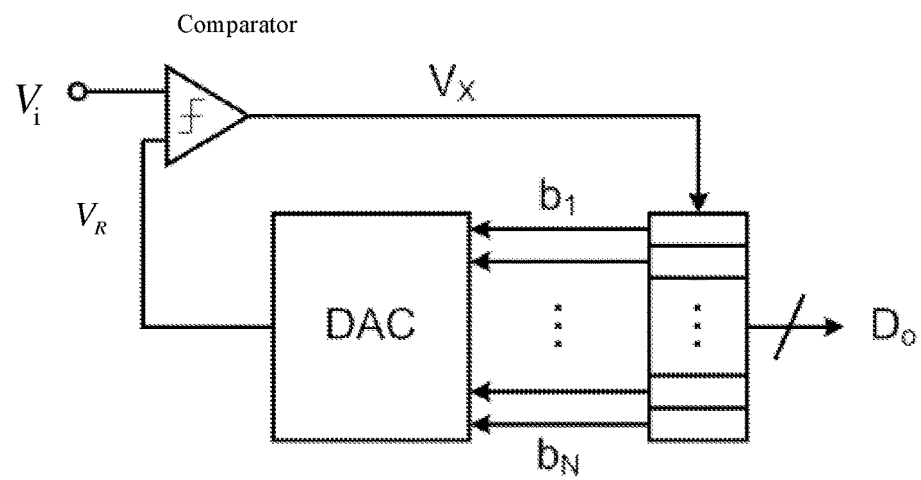
FIG. 1 is a diagram showing the conversion principle of an SAR analog-to-digital converter.
Figure 2:
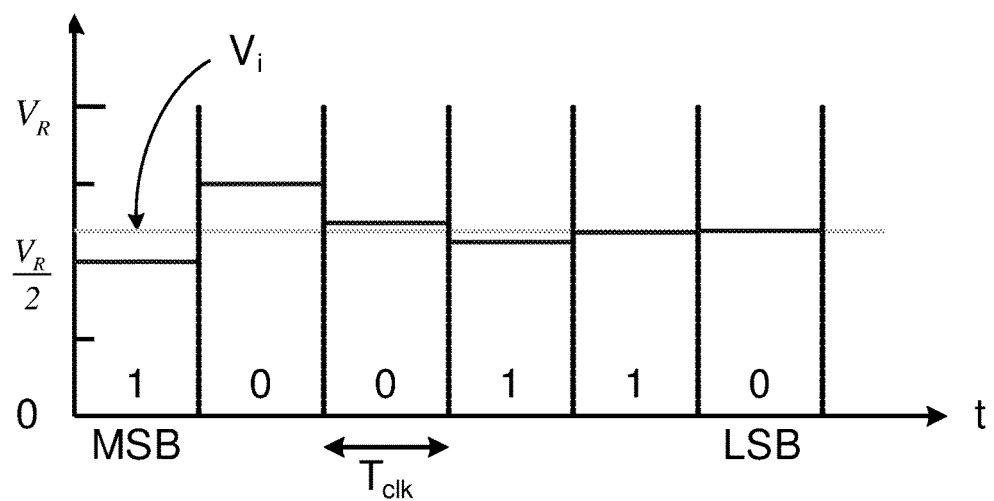
FIG. 2 is a schematic diagram of a successive approximation process of the SAR analog-to-digital converter.
Figure 3:
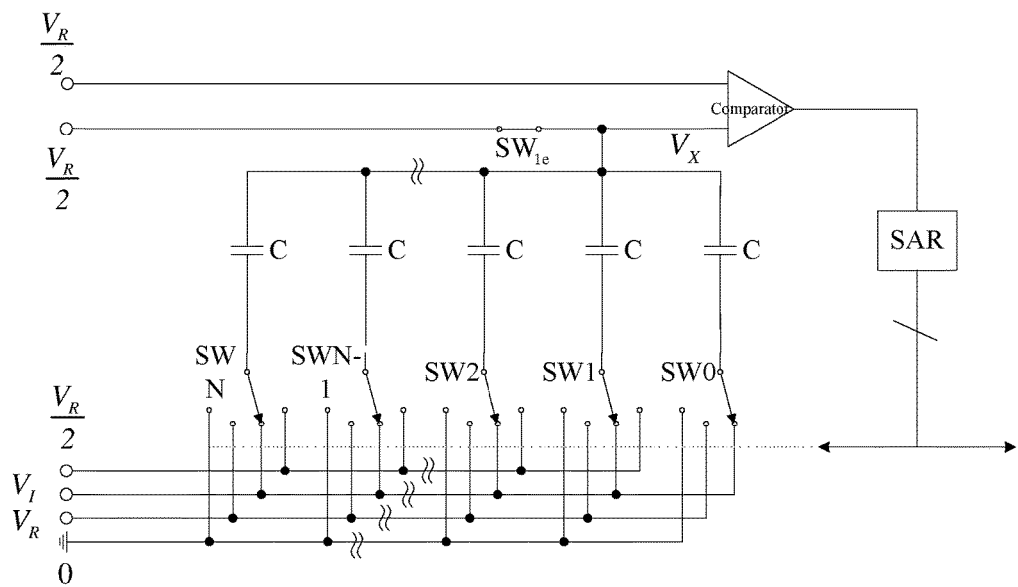
FIG. 3 illustrates a DAC capacitor array in the related art.
Figure 4:
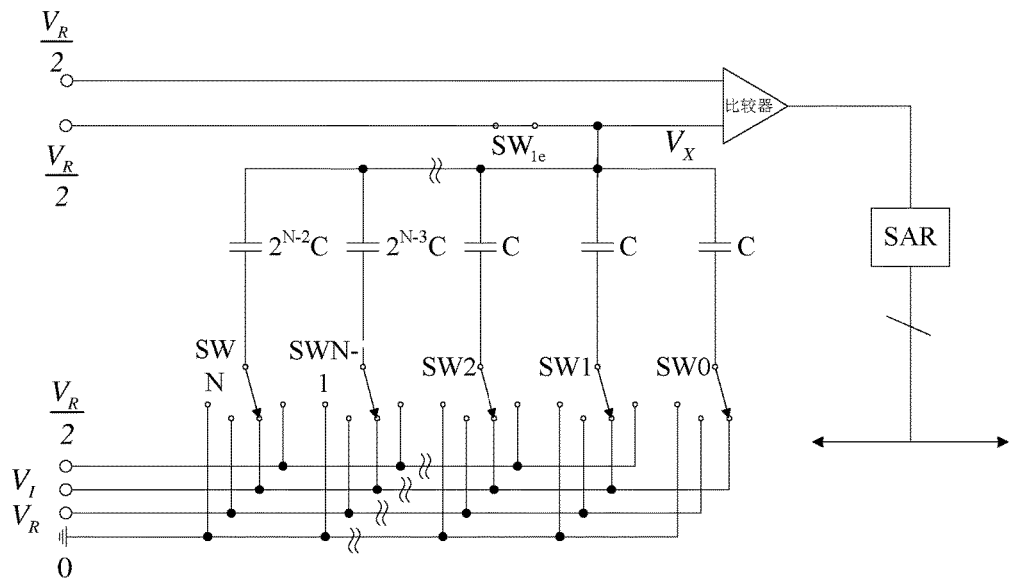
FIG. 4 illustrates another DAC capacitor array in the related art.
Figure 5:
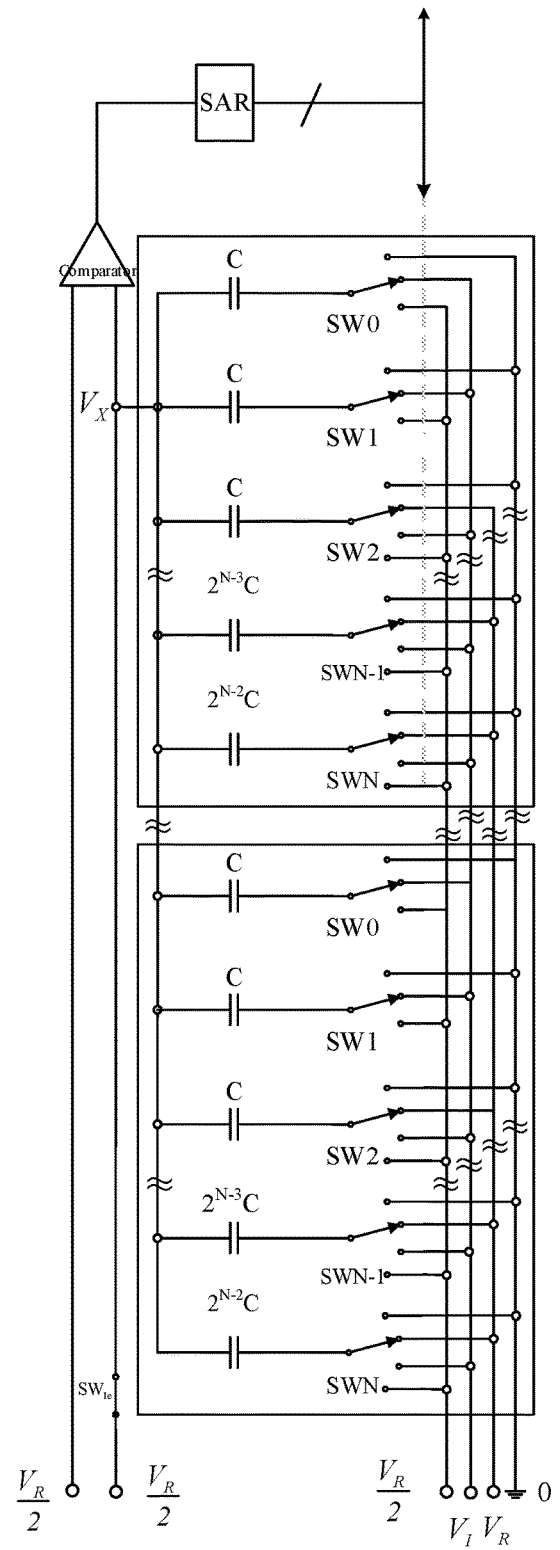
FIG. 5 is a DAC capacitor array according to an embodiment of the present disclosure.

In an embodiment of the present disclosure, referring to FIG. 5, a DAC capacitor array is applied in an SAR analog-to-digital converter. Specifically, according to the embodiment of the present disclosure, a DAC capacitor array between a binary weighting-based DAC capacitor and a unit capacitor-based DAC capacitor array is disclosed by combining and changing the conventional two DAC capacitor arrays in the background. The DAC capacitor array includes a plurality of sub-capacitor arrays that are connected in parallel. As can be seen from FIG. 5, the DAC capacitor array according to the embodiment of the present disclosure may be divided into a plurality of identical sub-capacitor arrays. These identical sub-capacitor arrays may be analogously and functionally considered as the unit capacitors as illustrated in FIG. 3 in the background. In the interior of each sub-capacitor array, the capacitors are arranged in a binary weighting manner according to the capacitance values to form a capacitor array. Specifically, each of the plurality of sub-capacitor arrays includes:

a capacitor group, including N capacitors connected in parallel, N being a positive integer; and a primary switch and a plurality of multiplexers; wherein one terminal of each capacitor in the capacitor group is connected to an input terminal of a comparator and to an input source via the primary switch; for ease of description, the terminal of each capacitor that are connected to the input terminal of the comparator are called a common terminal; and the other terminal of each capacitor of the capacitor group are connected to a plurality of input sources via a corresponding multiplexer; for ease of description, the other terminal of each capacitor is called a free terminal, and the free terminal may be connected and switched between the plurality of input sources.

The SAR analog-to-digital converter employing the above capacitor array is a single-ended SAR analog-to-digital converter, and has only one analog input which is sampled to the DAC capacitor array.

In an embodiment of the present disclosure, the SAR analog-to-digital converter further includes a symmetrical capacitor array; wherein one terminal of each capacitor of the symmetrical capacitor array is connected to the other terminal of the comparator. Specifically, the analog-to-digital convertor including the symmetrical capacitor arrays is a differential analog-to-digital converter, and correspondingly includes two inputs $V_{ip}$ and $V_{in}$. $V_{ip}$ and $V_{in}$ are respectively sampled to one of the two symmetrical capacitor arrays, and are respectively connected to two input terminals of the comparator. The capacitor array to which $V_{ip}$, is input may be connected to a positive input terminal of the comparator, and the capacitor array to which $V_{in}$ is input may be connected to a negative input terminal of the comparator.

In an embodiment of the present disclosure, the sub-capacitor array includes a plurality of capacitors, and the capacitor groups may be divided into a significant-bit sub-capacitor group, a non-significant-bit sub-capacitor group and a supplement-bit capacitor. The supplement-bit capacitor is a unit capacitor, and the significant-bit sub-capacitor group includes P capacitors, the non-significant-bit sub-capacitor group includes M capacitors. P and M are both a positive integer less than N. Specifically, M falls within a value range of 0 to N, where N, P and M satisfy the following equation:

$$N=M+P+1.$$

Three capacitors may be unit capacitors, and the non-unit capacitors are arranged in a binary weighting manner according to the capacitance values. Preferably, the capacitors in the sub-capacitor array may not be arranged in a binary weighting manner.

In an embodiment of the present disclosure, the input source includes an analog input signal and a plurality of reference voltages, the reference voltage has a voltage value range of 0 to $V_R$, reference voltages to which the significant-bit sub-capacitor group is connected include 0, $$\frac{V_R}{2}$$

and $V_R$, reference voltages to which the non-significant-bit sub-capacitor group is connected includes $$\frac{2^M-1}{2^{M+1}}V_R, \frac{V_R}{2} \text{ and } \frac{2^M+1}{2^{M+1}}V_R,$$

and value of $V_R$ may be adjustable.

Further, the capacitors are arranged from the most significant bit to the least significant bit, capacitance values of the capacitors in the significant-bit sub-capacitor group are sequentially $H_P$, $H_{P-1}$, ..., $H_2$ and $H_1$, and capacitance values of the capacitors in the non-significant-bit sub-capacitor group are sequentially $L_M$, $L_{M-1}$, ..., $L_2$ and $L_1$. As an optional solution of this embodiment, according to a descending order of the capacitances, values of $H_{P-1}V_R$, $H_2V_R$, ..., $H_2V_R$, $H_1V_R$, $$\frac{1}{2^{M+1}}L_M V_R, \frac{1}{2^{M+1}}L_{M-1}V_R, \ldots, \frac{1}{2^{M+1}}L_2 V_R, \frac{1}{2^{M+1}}L_1 V_R$$

satisfy a geometric relation having an equal ratio of 2. In another optional embodiment of this embodiment, according to a descending order of the capacitances, values of $H_{P-1}V_R$, $H_2V_R$, ..., $H_2V_R$, $H_1V_R$, $$\frac{1}{2^{M+1}}L_M V_R, \frac{1}{2^{M+1}}L_{M-1}V_R, \ldots, \frac{1}{2^{M+1}}L_2 V_R, \frac{1}{2^{M+1}}L_1 V_R$$

may satisfy a geometric relation having an equal ratio of any positive integer, or may not satisfy a geometric relation.

Figure 6:
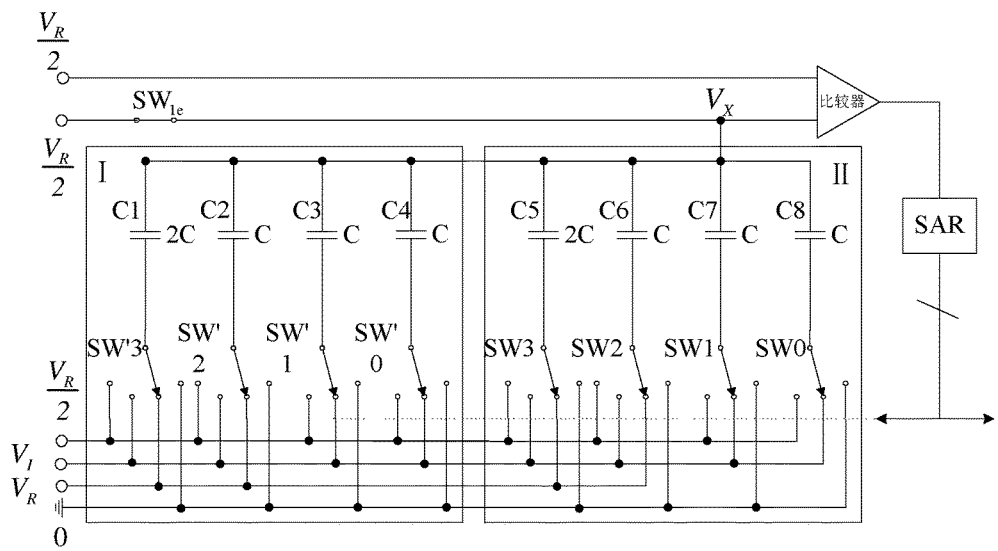
FIG. 6 illustrates a DAC capacitor array for use in a four-bit SAR analog-to-digital converter according to an embodiment of the present disclosure.

The above embodiment may be described by using a specific example. Referring to FIG. 6, using a 4-bit SAR analog-to-digital converter as an example, the DAC capacitor array is divided into two identical sub-capacitor arrays, which are sub-capacitor array I and a sub-capacitor array II. The sub-capacitor array I and the sub-capacitor array II may be considered functionally similar to the unit capacitor as illustrated in FIG. 3 in the background. In the interior of the sub-capacitor array I and the sub-capacitor array II, the number of capacitors is N, and N=4, and correspondingly the number of capacitors M in the non-significant-bit sub-capacitor group may fall within the value range of 0 to 2 and the number of capacitors in the significant-bit sub-capacitor group is P=N−M−1.

Specifically, the value of the reference voltage connected to the non-significant-bit sub-capacitor group may affect division of the sub-capacitor array regarding the significant-bit sub-capacitor group and the non-significant-bit sub-capacitor group, and values of the capacitors in the sub-capacitor array, or the division of the sub-capacitor array regarding the significant-bit sub-capacitor group and the non-significant-bit sub-capacitor group may affect the values of the reference voltage connected to the non-significant-bit sub-capacitor group and the values of the capacitors in the sub-capacitor array.

For example, in the sub-capacitor array including four capacitors as illustrated in FIG. 6, using the sub-capacitor array I as an example, if the reference voltage of the non-significant-bit sub-capacitor group is $$\frac{1}{4}V_R, \frac{V_R}{2} \text{ or } \frac{3}{4}V_R,$$

that is, M=1, the significant-bit sub-capacitor group includes a capacitor C1 and a capacitor C2, the non-significant-bit sub-capacitor group includes a capacitor C3. Based on the fact that the values of $H_{P-1}V_R$, $H_2V_R$, ..., $H_2V_R$, $H_1V_R$, $$\frac{1}{2^{M+1}}L_M V_R, \frac{1}{2^{M+1}}L_{M-1}V_R, \ldots, \frac{1}{2^{M+1}}L_2 V_R, \frac{1}{2^{M+1}}L_1 V_R$$

satisfy a geometric relation having an equal ratio of 2, in this case, capacitance value of capacitor C1 may be changed to C, capacitance value of capacitor C2 may be changed to 2C, and capacitors C3 and C4 remain unchanged. Nevertheless, the above values may also not satisfy the geometric relation having an equal ratio of 2, or may satisfy a geometric relation having a ratio of any other value. Obviously, different values of the reference voltage may affect the values of the capacitors in the sub-capacitor array. Based on this theory, the capacitance values of the capacitors in the DAC capacitor array may be changed by adjusting the reference voltage, such that the unit capacitors of the DAC capacitor array may be reduced.

Optionally, in the sub-capacitor array I and the sub-capacitor array II, the capacitance values of the capacitors may be arranged in a binary manner, or may be arranged in another manner instead of the binary manner.

In an embodiment of the present disclosure, an SAR analog-to-digital converter is provided. The SAR analog-to-digital converter includes the DAC capacitor array described in the above embodiment.

Figure 7:
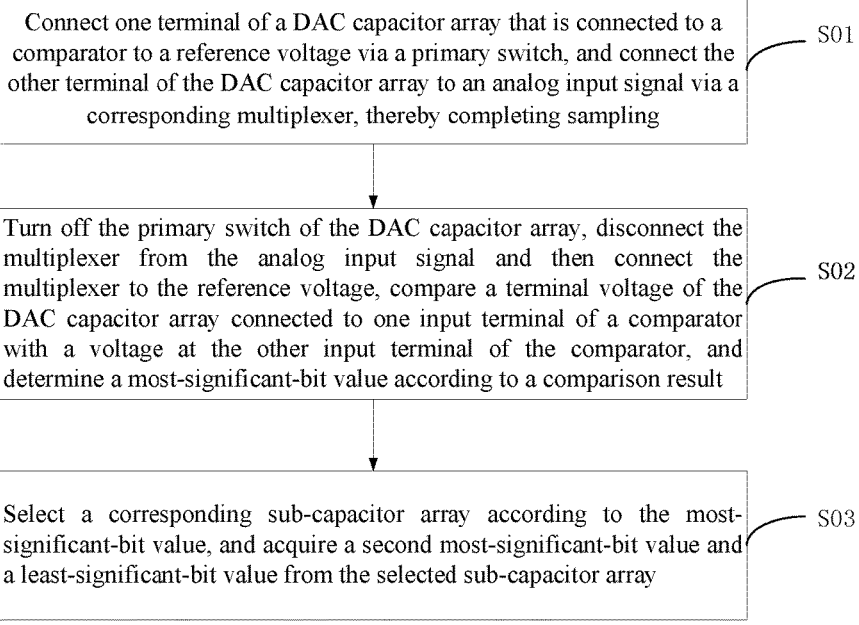
FIG. 7 illustrates a conversion process according to an embodiment of the present disclosure.

In an embodiment of the present disclosure, as illustrated in FIG. 7, a method for reducing power consumption of an SAR analog-to-digital converter is provided.

It is known that with respect to an SAR analog-to-digital converter employing a DAC capacitor array, when a capacitor is turned on or turned off in the DAC capacitor array, energy consumption is caused. Specifically, the energy consumption is determined by the following formula:

$$E=CV^2$$

In the above formula, C denotes the capacitance value of a capacitor, and V denotes a voltage variation on the capacitor. Generally in the SAR analog-to-digital converter, the capacitance value is determined by noise and matching. The noise refers to that resistance thermal noise enters to the capacitor via the sampling and is then superimposed on a useful signal, and the matching refers to that a manufactured capacitor is deviated from a design capacitor due to a limited precision during the manufacturing, and thus a capacitance ratio of any two capacitors is inconsistent with the designed value, which affect the ADC precision to some extent. The voltage is determined by a dynamic range of the ADC, which specifically refers to an input voltage range of the ADC.

In an embodiment of the present disclosure, the method for reducing power consumption of an SAR analog-to-digital converter includes the following steps:

S1: at a sampling stage, connecting one terminal of a DAC capacitor array that is connected to a comparator to a reference voltage $$\frac{V_R}{2}$$

via a primary switch, and connecting the other terminal of the DAC capacitor array to an analog input signal via a corresponding multiplexer, thereby completing the sampling; specifically, the sampling may be an upper electrode plate sampling or a lower electrode plate sampling, wherein the upper electrode plate sampling refers to that a sampling signal and an input of the comparator are simultaneously connected to one terminal of the comparator, and the lower electrode plate sampling refers to that a sampling signal and an input of the comparator are respectively connected to two terminals of a sampling capacitor;

S2: at a conversion stage, turning off the primary switch of the DAC capacitor array, disconnecting the multiplexer from the analog input signal and then connecting the multiplexer to the reference voltage $$\frac{V_R}{2},$$

comparing a terminal voltage of the DAC capacitor array connected to one input terminal of the comparator with a voltage at the other input terminal of the comparator, and determining a most-significant-bit value according to a comparison result;

S3: selecting a corresponding sub-capacitor array according to the most-significant-bit value, and acquiring a second most-significant-bit value and a least-significant-bit value from the selected sub-capacitor array.

Specifically, the significant-bit result of the SAR analog-to-digital converter determines in which sub-capacitor array the non-significant-bit conversion is carried out. Hereinafter description is given using a specific example. Referring to the DAC capacitor array for use in a four-bit SAR analog-to-digital converter as illustrated in FIG. 6, the DAC capacitor array includes a sub-capacitor array I and a sub-capacitor array II. Specifically, if the most significant bit is 1, the non-significant-bit conversion is carried out in the sub-capacitor array I; and if the most significant bit is 0, the non-significant-bit conversion is carried out in the sub-capacitor array II.

Optionally, if the values of the remaining bits are determined according to two most significant bits, four sub-capacitor arrays may be employed. Specifically, one of the four sub-capacitor arrays is selected according to the two most significant bits to determine the values of the remaining bits of the digital signal.

Optionally, the selecting a corresponding sub-capacitor array according to the most-significant-bit value includes:

connecting non-selected sub-capacitor arrays to a reference voltage 0 or a reference voltage $V_R$ when the sub-capacitor array is selected.

Specifically, the reference voltage to which the capacitors in each sub-capacitor array are connected is determined according to the significant-bit result of the SAR analog-to-digital converter. Hereinafter description is given using a specific example. Referring to the DAC capacitor array for use in a four-bit SAR analog-to-digital converter as illustrated in FIG. 6, the DAC capacitor array includes a sub-capacitor array I and a sub-capacitor array II. Specifically, if the most significant bit is 1, the sub-capacitor array II may be connected to the reference voltage 0 and the non-significant-bit conversion is carried out in the sub-capacitor array I; and if the most significant bit is 0, the capacitors in the sub-capacitor array may be connected to the reference voltage $V_R$ and the non-significant-bit conversion is carried out in the sub-capacitor array II.

Optionally, the acquiring a second most-significant-bit value and a least-significant-bit value from the selected sub-capacitor array includes:

adjusting the reference voltages of the capacitors in the selected sub-capacitor array as $$\frac{2^M-1}{2^{M+1}}V_R \text{ or } \frac{2^M+1}{2^{M+1}}V_R$$

according to the comparison result between the two terminal voltages of the comparator, wherein M is the number of capacitors in a non-significant-bit sub-capacitor group in the selected sub-capacitor array.

Optionally, the DAC capacitor array may be expanded to include more sub-capacitor arrays. The significant bit value of the SAR analog-to-digital converter employing the expanded DAC capacitor array determines in which sub-capacitor array the non-significant-bit conversion is carried out.

The method for reducing power consumption of an SAR analog-to-digital converter according to the above embodiment is described in detail with reference to a specific example. Referring to the DAC capacitor array as illustrated in FIG. 6, using a four-bit SAR analog-to-digital converter as an example, the four-bit SAR analog-to-digital converter employs the DAC capacitor array as illustrated in FIG. 6. In the DAC capacitor array, capacitor C1 and capacitor C5 are the most significant bits in the two sub-capacitor arrays respectively. Assume that the dynamic range of the SAR analog-to-digital converter is $V_R$ to 0.

As seen from FIG. 6, the DAC capacitor array is divided into two identical sub-capacitor arrays, and these two identical sub-capacitor arrays may be considered functionally similar as the unit capacitor as illustrated in FIG. 3 in the background.

Specifically, the four-bit SAR analog-to-digital converter carries out analog-to-digital conversion as follows:

At a sampling stage, the free terminal of the DAC capacitor array is connected to the analog signal $V_i$ via a multiplexer; meanwhile the common terminal of the capacitors are connected to the reference voltage $$\frac{V_R}{2}$$

and are connected to the input terminal of the comparator; and the input voltage (the analog signal) $V_i$ is sampled to the free terminal of each capacitor in the DAC capacitor array as illustrated in FIG. 6.

(2) At a conversion stage, the free terminal of each capacitor of the DAC capacitor array is connected to the reference voltage $$\frac{V_R}{2}$$

via the multiplexers, and the common terminal thereof is disconnected from the reference voltage $$\frac{V_R}{2}$$

and is only connected to the input terminal of the comparator.

In this case, according to the law of conservation of charge, a point voltage $V_X$ at the common terminal may be calculated as:

$$V_X = V_R - V_i.$$

(3) comparing the $V_X$ with $$\frac{V_R}{2}.$$

In this embodiment, capacitors C1, C2, C5 and C6 belong to the significant-bit sub-capacitor group, capacitors C3, C4, C7 and C8 belong to the non-significant-bit sub-capacitor group.

If $V_X$ is greater than $$\frac{V_R}{2},$$

the free ends of the sub-capacitor array II may all be connected to the reference voltage 0, that is, connected to the ground. In this case, the point voltage $V_X$ of the common terminal changes to $V_{X'}$, and $V_{X'}$ may be calculated according to the law of conservation of charge as follows:

$$V'_X = V_R - V_i - \frac{V_R}{4} = V_X - \frac{V_R}{4}.$$

During subsequent calculation of the second most-significant-bit values, the reference voltage connected to the free ends of the capacitors in the sub-capacitor array I may only be changed.

If $V_X$ is less than $$\frac{V_R}{2},$$

the free ends of the sub-capacitor array I may all be connected to the reference voltage $V_R$. In this case, $V_X$ changes to $V_{X'}$, and $V_{X'}$ may be calculated according to the law of conservation of charge as follows:

$$V'_X = V_R - V_i + \frac{V_R}{4} = V_X + \frac{V_R}{4}.$$

During subsequent calculation of the second most-significant-bit values, the reference voltage connected to the free ends of the capacitors in the sub-capacitor array II may only be changed.

(5) Afterward, $V_{X'}$ is compared with $$\frac{V_R}{2},$$

and the reference voltage connected to the free terminal of the capacitor C1 is changed according to the comparison result. If $$V'_X > \frac{V_R}{2},$$

the capacitor C1 is connected to the ground voltage, and if $$V'_X < \frac{V_R}{2},$$

the capacitor C1 is connected to the reference voltage $V_R$. Such steps are repeated for the capacitor C2.

(6) Then, according to the relation between the point voltage $V_{X'}$ at the common terminal of each capacitor and $$\frac{V_R}{2},$$

the reference voltage of the free terminal of the capacitor C3 is changed. Different from C1 and C2, in this case C3 may be connected to the reference voltage $$\frac{V_R}{4} \text{ or } \frac{3V_R}{4}.$$

Likewise, the same case may be applied to capacitor C4.

likewise, using a 12-bit SAR analog-to-digital converter as an example, the DAC capacitor array included therein is divided into four 10-bit capacitor arrays. The reference voltage of the last four-bit capacitor in each 10-bit capacitor array is changed to ⅛ of the original reference voltage. Specifically, the DAC capacitor array is formed of four identical sub-capacitor arrays, and a result of two significant bits of the SAR analog-to-digital converter determines in which one of the four unit capacitor arrays the non-significant 10 bits conversion is carried out. The non-significant 10-bit sub-capacitor arrays are not arranged in a traditional manner of $2^9C$, $2^8C$, $2^7C$, ..., $2C$, $C$, $C$, but arranged in a manner of two groups including $2^6C$, $2^5C$, $2^4C$, ..., $C$ and 4C, 2C, C, C respectively. The non-significant-bit portion 4C, 2C, C, C is connected to the reference voltage $$\frac{V_R}{8}$$

or the reference voltage 0 according to the comparison result thereof. The other capacitors are connected to the reference voltage $$\frac{V_R}{8}$$

or the reference voltage 0 according to the comparison result thereof (a ADC result corresponding to the bit).

Based on the method according to this embodiment, by means of calculation, the capacitor arrangement in the high-precision SAR analog-to-digital converter may be optimized with respect to different process parameters, so as to reduce the power consumption and chip area.

With the DAC capacitor array, the analog-to-digital converter and the method for reducing power consumption of the analog-to-digital converter according to embodiments of the present disclosure, the number of capacitors in the capacitor array may be reduced by optimizing the DAC capacitor array, which reduces the overall capacitance of the DAC capacitor array. In this way, the size of the SAR analog-to-digital converter may be reduced, the power consumption may be reduced, and meanwhile the cost of chips may be lowered in manufacture of the chips. In addition, by modifying the conversion process between the analog signal and the digital signal, the voltage variation range between two terminals of the capacitor is narrowed and thus the overall power consumption may be reduced.

Described above are exemplary embodiments of the present disclosure, which are not intended to limit the protection scope of the present disclosure. Although the present disclosure is described in detail with reference to the above embodiments, a person skilled in the art would still make modifications to the specific embodiments and the technical solutions disclosed therein, or would still make equivalent replacements to a part of the technical features therein. Any equivalent structure made based on the specification and accompanying drawings of the present disclosure, even if being directly or indirectly applied to some other related technical fields, shall all fall within the protection scope of the present disclosure.

What is claimed is:

1. A digital-to-analog converter (DAC) capacitor array, the DAC capacitor array being applied in an SAR analog-to-digital converter, wherein the DAC capacitor array comprises a plurality of identical sub-capacitor arrays that are connected in parallel, each of the plurality of sub-capacitor arrays comprising:
   a capacitor group, comprising N capacitors that are connected in parallel, wherein N is a positive integer; and
   a primary switch and a plurality of multiplexers; wherein
      one terminal of each capacitor in the capacitor group connects to
         an input terminal of a comparator, and connects to an input source via the primary switch; and
      the other terminals of each capacitor in the capacitor group connects to a plurality of input sources via corresponding multiplexers, respectively.

2. The DAC capacitor array according to claim 1, further comprising a symmetrical capacitor array; wherein one terminal of each capacitor in the symmetrical capacitor array is connected to the other terminal of the comparator.

3. The DAC capacitor array according to claim 1, wherein the capacitor group comprises a significant-bit sub-capacitor group, a non-significant-bit sub-capacitor group and a supplement-bit capacitor; wherein the supplement-bit capacitor comprises a unit capacitor, the number of capacitors in the significant-bit capacitor group is P, and the number of capacitors in the non-significant-bit sub-capacitor group is M, and P and M are both a positive integer less than N and satisfy the following equation:

$$N=M+P+1.$$

4. The DAC capacitor array according to claim 3, wherein the plurality of input sources comprise an analog input signal and a plurality of reference voltages, the reference voltages have a voltage value range of 0 to $V_R$, reference voltages to which the significant-bit sub-capacitor group is connected comprise 0, $$\frac{V_R}{2}$$

and $V_R$, reference voltages to which the non-significant-bit sub-capacitor group is connected comprise $$\frac{2^M-1}{2^{M+1}}V_R, \frac{V_R}{2} \text{ and } \frac{V_R}{2}V_R,$$

and $V_R$ has an adjustable value.

5. The DAC capacitor array according to claim 3, wherein the capacitors are arranged from high to low, capacitance values of the capacitors in the significant-bit sub-capacitor group are sequentially $H_P, H_{P-1}, \ldots, H_2$ and $H_1$, and capacitance values of the capacitors in the non-significant-bit sub-capacitor group are sequentially $L_M, L_{M-1}, \ldots, L_2$ and $L_1$; wherein values of $H_{P-1}V_R, H_2V_R, \ldots, H_2V_R, H_1V_R$, $$\frac{1}{2^{M+1}}L_MV_R, \frac{1}{2^{M+1}}L_{M-1}V_R, \ldots, \frac{1}{2^{M+1}}L_2V_R, \frac{1}{2^{M+1}}L_1V_R$$

satisfy a geometric relation having an equal ration of 2.

6. A successive approximation register (SAR) analog-to-digital converter, comprising: a comparator, a register connected to an output terminal of the comparator, and a digital-to-analog converter (DAC) capacitor array connected to an input terminal of the comparator; wherein the DAC capacitor array comprises:
   a plurality of identical sub-capacitor arrays that are connected in parallel, each of the plurality of sub-capacitor arrays comprises:
      a capacitor group comprising N capacitors that are connected in parallel; wherein N is a positive integer; and
      a primary switch and a plurality of multiplexers; wherein
         one terminal of each capacitor in the capacitor group connects to an input terminal of a comparator, and connects to an input source via the primary switch; and the other terminals of each capacitor in the capacitor group connects to a plurality of input sources via corresponding multiplexers respectively.

7. The SAR analog-to-digital converter according to claim 6, further comprising a symmetrical capacitor array; wherein one terminal of each capacitor in the symmetrical capacitor array is connected to the other terminal of the comparator.

8. The SAR analog-to-digital converter according to claim 6, wherein the capacitor group comprises a significant-bit sub-capacitor group, a non-significant-bit sub-capacitor group and a supplement-bit capacitor; wherein the supplement-bit capacitor comprises a unit capacitor, the number of capacitors in the significant-bit capacitor group is P, and the number of capacitors in the non-significant-bit sub-capacitor group is M, and P and M are both a positive integer less than N and satisfy the following equation:

$N=M+P+1$.

9. The SAR analog-to-digital converter according to claim 8, wherein the plurality of input sources comprise an analog input signal and a plurality of reference voltages, the reference voltages have a voltage value range of 0 to $V_R$, reference voltages to which the significant-bit sub-capacitor group is connected comprise 0, $$\frac{V_R}{2}$$

and $V_R$, reference voltages to which the non-significant-bit sub-capacitor group is connected comprise $$\frac{2^M-1}{2^{M+1}}V_R, \frac{V_R}{2} \text{ and } \frac{V_R}{2}V_R,$$

and $V_R$ has an adjustable value.

10. The SAR analog-to-digital converter according to claim 8, wherein the capacitors are arranged from high to low, capacitance values of the capacitors in the significant-bit sub-capacitor group are sequentially $H_P, H_{P-1}, \ldots, H_2$ and $H_1$, and capacitance values of the capacitors in the non-significant-bit sub-capacitor group are sequentially $L_M, L_{M-1}, \ldots, L_2$ and $L_1$; wherein values of $H_{P-1}V_R, H_2V_R, \ldots, H_2V_R, H_1V_R$, $$\frac{1}{2^{M+1}}L_M V_R, \frac{1}{2^{M+1}}L_{M-1} V_R, \ldots, \frac{1}{2^{M+1}}L_2 V_R, \frac{1}{2^{M+1}}L_1 V_R$$

satisfy a geometric relation having an equal ration of 2.

11. A method for reducing power consumption of a successive approximation (SAR) analog-to-digital converter, comprising:

at a sampling stage, connecting one terminal of a DAC capacitor array that is connected to an input terminal of a comparator to a reference voltage $$\frac{V_R}{2}$$

via a primary switch, and connecting the other terminal of the DAC capacitor array to an analog input signal via a corresponding multiplexer, thereby completing a sampling; and at a conversion stage, turning off the primary switch of the DAC capacitor array, disconnecting the multiplexer from the analog input signal and then connecting the multiplexer to the reference voltage $$\frac{V_R}{2},$$

comparing a terminal voltage of the DAC capacitor array connected to one input terminal of a comparator with a voltage at the other input terminal of the comparator to obtain a comparison result, determining a most-significant-bit value according to the comparison result, selecting a corresponding sub-capacitor array according to the most-significant-bit value, and acquiring a second most-significant-bit value and a least-significant-bit value from the selected sub-capacitor array.

12. The method for reducing power consumption of an SAR analog-to-digital converter according to claim 11, wherein the selecting a corresponding sub-capacitor array according to the most-significant-bit value comprises:

Connecting non-selected sub-capacitor arrays to a reference voltage 0 or a reference voltage $V_R$ when the corresponding sub-capacitor array is selected.

13. The method for reducing power consumption of an SAR analog-to-digital converter according to claim 11, wherein the acquiring a second most-significant-bit value and a least-significant-bit value from the selected sub-capacitor array comprises:

Adjusting the reference voltages of the capacitors in the selected sub-capacitor array as $$\frac{2^M-1}{2^{M+1}}V_R \text{ or } \frac{2^M+1}{2^{M+1}}V_R$$

according to the comparison result, wherein M is the number of capacitors in a non-significant-bit sub-capacitor group in the corresponding sub-capacitor array being selected.

\* \* \* \* \*